United States Patent
Suematsu et al.

(10) Patent No.: US 8,987,720 B2
(45) Date of Patent: Mar. 24, 2015

(54) TRANSPARENT SURFACE ELECTRODE, ORGANIC ELECTRONIC ELEMENT, AND METHOD FOR MANUFACTURING TRANSPARENT SURFACE ELECTRODE

(75) Inventors: Takatoshi Suematsu, Tokyo (JP); Akihiko Takeda, Sagamihara (JP)

(73) Assignee: Konica Minolta, Inc. (JP)

(*) Notice: Subject to any disclaimer, the term of this patent is extended or adjusted under 35 U.S.C. 154(b) by 0 days.

(21) Appl. No.: 13/994,006

(22) PCT Filed: Dec. 7, 2011

(86) PCT No.: PCT/JP2011/078313
§ 371 (c)(1),
(2), (4) Date: Jun. 13, 2013

(87) PCT Pub. No.: WO2012/081471
PCT Pub. Date: Jun. 21, 2012

(65) Prior Publication Data
US 2013/0285041 A1 Oct. 31, 2013

(30) Foreign Application Priority Data
Dec. 13, 2010 (JP) ................................ 2010-276713

(51) Int. Cl.
*H01L 51/52* (2006.01)
*H01L 51/56* (2006.01)
*H05B 33/28* (2006.01)

(52) U.S. Cl.
CPC ........ *H01L 51/5203* (2013.01); *H01L 51/5212* (2013.01); *H01L 51/5215* (2013.01); *H01L 51/5228* (2013.01); *H01L 51/5234* (2013.01); *H01L 51/56* (2013.01); *H05B 33/28* (2013.01)
USPC .............................................. 257/40; 438/99

(58) Field of Classification Search
CPC .................................................. H01L 51/5215
See application file for complete search history.

(56) References Cited

U.S. PATENT DOCUMENTS

2002/0022191 A1 2/2002 Lamotte et al.
2003/0124319 A1 7/2003 Lamotte et al.
(Continued)

FOREIGN PATENT DOCUMENTS

EP 1297385 A 4/2003
EP 1402319 A1 3/2004
(Continued)

OTHER PUBLICATIONS

PCT International Preliminary Report on Patentability and Written Opinion with English Translation for International Application No. PCT/JP2011/078313: International Filing Date: Dec. 7, 2011; 11 pgs.

(Continued)

*Primary Examiner* — Stephen W Smoot
(74) *Attorney, Agent, or Firm* — Cantor Colburn LLP

(57) ABSTRACT

The purpose of the present invention is to provide a transparent surface electrode that maintains high transparency, suppresses the occurrence of leak currents, and has superior storage stability and resistance to damage by bending, a method for manufacturing the same, and an organic electronic element using the same. This transparent surface electrode has a metal pattern conductive layer that contains a metal on a transparent base material, and the transparent surface electrode also has a transparent polymer conductive layer, which contains that base material and a conductive polymer, on that metal pattern conductive layer. The transparent surface electrode is characterized by the surface roughness (Ra (surface roughness provided for by JIS, B601 (1994))) of the metal pattern conductive layer being 20 nm or less, and the polymer conductive layer containing a non-conductive polymer having a hydroxyl group.

6 Claims, 1 Drawing Sheet

(56) References Cited

U.S. PATENT DOCUMENTS

| | | |
|---|---|---|
| 2004/0048048 A1 | 3/2004 | Lamotte et al. |
| 2004/0048051 A1 | 3/2004 | Lamotte et al. |
| 2006/0015147 A1 | 1/2006 | Persson et al. |
| 2009/0021153 A1 | 1/2009 | Lee et al. |
| 2009/0236962 A1 | 9/2009 | Fujimoto et al. |

FOREIGN PATENT DOCUMENTS

| | | | |
|---|---|---|---|
| JP | 2002-179954 A | 6/2002 | |
| JP | 2002-266007 A | 9/2002 | |
| JP | 2004-504693 A | 2/2004 | |
| JP | 2004-149871 A | 5/2004 | |
| JP | 2005-302508 A | 10/2005 | |
| JP | 2006-190671 A | 7/2006 | |
| JP | 2006-233252 A | 9/2006 | |
| JP | 2008-133322 A | 6/2008 | |
| JP | 2009-59666 A | 3/2009 | |
| JP | 2009-87843 A | 4/2009 | |
| JP | 2009-230960 A | 10/2009 | |
| JP | 2010-73415 A | 4/2010 | |
| JP | 2010-80692 A | 8/2010 | |
| WO | 0206898 A2 | 1/2002 | |
| WO | 03001299 A1 | 1/2003 | |
| WO | 2010/082428 A1 | 7/2010 | |
| WO | WO 2012/039240 A1 * | 3/2012 | ............ H01B 13/00 |

OTHER PUBLICATIONS

International Search Report for International Application No. PCT/JP2011/078313, mailed Feb. 7, 2012, with English translation.

* cited by examiner

TRANSPARENT SURFACE ELECTRODE, ORGANIC ELECTRONIC ELEMENT, AND METHOD FOR MANUFACTURING TRANSPARENT SURFACE ELECTRODE

CROSS REFERENCE TO RELATED APPLICATIONS

This is the U.S. national stage of application No. PCT/JP2011/078313, filed on 7 Dec. 2011. Priority under 35 U.S.C. §119 (a) and 35 U.S.C. §365(b) is claimed from Japanese Application No. 2010-276713, filed 13 Dec. 2010, the disclosure of which is also incorporated herein by reference.

TECHNICAL FIELD

The present invention relates to an electrode used for an organic electronic element, and in particular to a transparent surface electrode used for the organic electronic element, a method for manufacturing the same, and an organic electronic element using the same.

BACKGROUND ART

Organic electronic devices based on organic electroluminescence (abbreviated as organic EL, hereinafter), organic solar cell, for example, have attracted public attention. In these sort of devices, transparent surface electrode has been understood as an indispensable component technology. Conventionally, ITO transparent electrode, composed of an indium-tin composite oxide (ITO) film formed on a transparent substrate by vacuum evaporation or sputtering, has been used as the transparent surface electrode, by virtue of its performances including electroconductivity and transparency.

The transparent electrode formed by vacuum evaporation or sputtering has, however, been suffering from high manufacturing cost due to poor productivity. In addition, the ITO transparent electrode has been becoming insufficient in resistivity, in view of satisfying recent demands for larger area of the organic electronic devices.

In view of satisfying such large-area organic electronic devices, there has been developed transparent electrodes configured by stacking a patterned electroconductive layer composed of a metal with a polymer electroconductive layer composed of an electroconductive polymer and such like, the transparent electrode characterized by high electroconductivity and excellent in-plane uniformity of electric current (see Patent Literatures 1 and 2, for example).

Possible methods of forming a patterned metal include a method based on physical development of silver halide particles, a method for forming a metal foil on a substrate followed by etching, and a method for printing a metal particle according to a predetermined pattern by gravure printing on a transparent substrate and the like (see Patent Literatures 3 and 4, for example). Among these methods, the method for forming the metal pattern by printing is thought to be an excellent method in view of economy and productivity.

However, the transparent electrode composed of a patterned metal electroconductive layer formed by printing and the polymer electroconductive layer composed of an electroconductive polymer stacked on the patterned metal electroconductive layer has been suffering from high frequency of current leakage, poor storability under high-temperature atmosphere, and insufficient durability against bending, when applied to the organic electronic devices.

CITATION LIST

Patent Literature

Patent Literature 1: Japanese Patent Application Laid-Open Publication No. 2005-302508
Patent Literature 2: Japanese Patent Application Laid-Open Publication No. 2009-87843
Patent Literature 3: Japanese Patent Application Laid-Open Publication No. 2010-80692
Patent Literature 4: Japanese Patent Application Laid-Open Publication No. 2010-73415

SUMMARY OF THE INVENTION

Technical Problem

The present invention is conceived after considering the above-described problems in the prior art, and an object of which is to provide a transparent surface electrode that is suppressed in current leakage while keeping high transparency and is excellent in storability and bending durability, a method for manufacturing the same and an organic electronic element using the same.

Solution to Problem

In the present invention, the above-described problems will be solved by the below ways.

1. A transparent surface electrode including:
a patterned metal electroconductive layer which contains a metal on a transparent base; and
a transparent polymer electroconductive layer which contains an electroconductive polymer over the base and the patterned metal electroconductive layer,
wherein the patterned metal electroconductive layer has a surface roughness Ra, specified by JIS B0601(1994), of 20 nm or smaller, and the polymer electroconductive layer contains a non-electroconductive polymer having hydroxyl groups.

2. The transparent surface electrode of Claim 1,
wherein the non-electroconductive polymer having hydroxyl groups is polymer (A) having structural units represented by the following formulae (1) and (2);

[Chemical Formula 1]

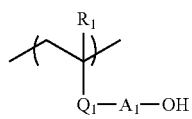

General Formula (1)

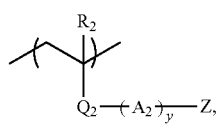

General Formula (2)

wherein, in the formulae, each of $R_1$ and $R_2$ independently represents a hydrogen atom or methyl group; each of $Q_1$ and $Q_2$ independently represents —C(=O)O— or —C(=O)NRa—; Ra represents a hydrogen atom or alkyl group; each of $A_1$ and $A_2$ independently represents a substituted or unsubstituted alkylene group or —(CH$_2$CHRbO)x-CH$_2$CHRb—; Rb represents a hydrogen atom or alkyl group; x represents an average number of the repeating units; y represents 0 or 1; z represents an alkoxy group, —O—C(=O)—Rc, —O—SO$_2$—Rd or —O—SiRe$_3$; and each of Rc, Rd and Re independently represents an alkyl group, perfluoroalkyl group or aryl group, and wherein a constitutive ratio m+n (mol %) satisfies 50≤m+n≤100 and m/(m+n)≥0.2 where a constitutive ratio of the structural unit represented by the formula (1) in the polymer (A) is m, and a constitutive ratio of the structural unit represented by the formula (2) in the polymer (A) is n.

3. A method for manufacturing a transparent surface electrode directed to manufacturing of the transparent surface electrode described in Claim 1 or 2, the method comprising:

forming the metal pattern by printing using a coating liquid for forming the patterned metal electroconductive layer which contains metal particles having an average particle size of 5 to 100 nm on the transparent base; and heating the formed metal pattern in the range from 300 to 500° C.

4. A method for manufacturing a transparent surface electrode directed to manufacturing of the transparent surface electrode described in Claim 1 or 2, the method including:

forming the metal pattern by printing using a coating liquid for forming a patterned metal electroconductive layer which contains metal particles having an average particle size of 5 to 100 nm on the transparent base, and chemically etching the formed metal pattern.

5. An organic electronic element including the transparent surface electrode described in Claim 1 or 2.

6. The organic electronic element of Claim 5, wherein the organic electronic element is an organic electroluminescent element.

Advantageous Effects of Invention

According to the above ways, a transparent surface electrode that is suppressed in current leakage while keeping high transparency and is excellent in storability and bending durability, a method for manufacturing the same and an organic electronic element using the same may be provided.

DESCRIPTION OF EMBODIMENTS

Figure 1A:
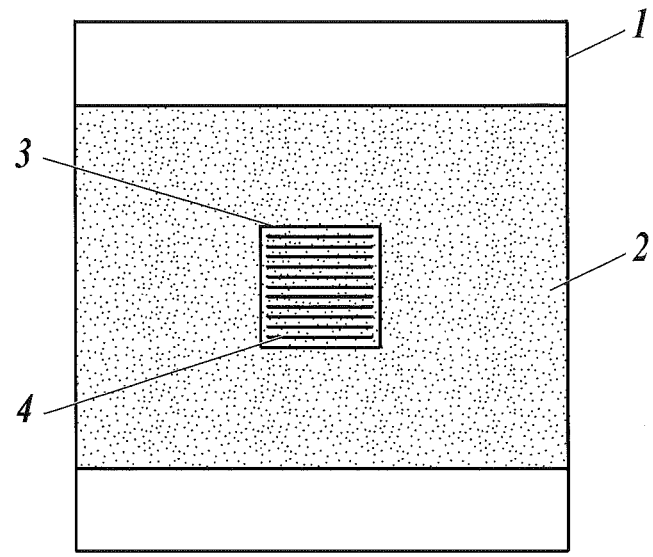
[FIG. 1A] This is a schematic drawing for explaining a method for measuring surface roughness Ra of a patterned metal electroconductive layer, which is a top view of the patterned metal electroconductive layer.

The present invention is characterized in that a transparent surface electrode including a patterned metal electroconductive layer which contains a metal on a transparent base, and a transparent polymer electroconductive layer which contains an electroconductive polymer over the base and the patterned metal electroconductive layer, wherein the patterned metal electroconductive layer has a surface roughness Ra (surface roughness specified by JIS B0601 (1994)) of 20 nm or smaller, and the polymer electroconductive layer contains a non-electroconductive polymer having hydroxyl groups.

The present invention can provide a transparent surface electrode for manufacturing an organic electronic element that is suppressed in frequency of current leakage and is excellent in storability and bending durability, particularly by adjusting the surface roughness of the patterned metal electroconductive layer provided on the transparent base in the range specified above.

Constituents of the transparent surface electrode of the present invention, and a method for manufacturing the same will be detailed below.

[Transparent Base]

"Transparent" in the context of the present invention means that the total luminous transmittance measured in the visible light region in compliance with JIS K7361-1:1997 (Plastics—Determination of the total luminous transmittance of transparent materials) is 70% or larger.

Materials composing the base in the present invention are not specifically limited so long as they are transparent, and materials publicly known for use in the organic electronic element are arbitrarily used.

In the present invention, resin film or flexible thin film glass is preferably used, from the viewpoints of, for example, hardness, readiness of forming of the electroconductive layer, lightness in weight, flexibility and adoptability to roll-to-roll production.

Examples of the resin film include polyester-based resin film composed of poly(ethylene terephthalate) (PET), poly(ethylene naphthalate) (PEN) or modified polyester; polyolefin-based resin film composed of polyethylene (PE) resin film, polypropylene (PP)-based resin film, polystyrene resin film or cyclic olefin resin; vinyl-based resin film composed of poly(vinyl chloride) or poly(vinylidene chloride); polyether ether ketone (PEEK) resin film, polysulfone (PSF) resin film, polyethersulfone (PES) resin film, polycarbonate (PC) resin film, polyamide resin film, polyimide resin film, acrylic resin film, and triacetyl cellulose (TAC) resin film.

Among these films, from the viewpoints of transparency, heat resistance, handleability, strength and economy, preferable are biaxially-stretched polyethylene terephthalate film, biaxially-stretched polyethylene naphthalate film, polyethersulfone film, and polycarbonate film, and more preferable are biaxially-stretched polyethylene terephthalate film, and biaxially-stretched polyethylene naphthalate film.

When the resin film is used, the thickness thereof preferably falls in the range from 1 to 1000 μm, and more preferably from 10 to 100 μm.

The flexible thin film glass suitably used for the transparent base in the present invention is exemplified by a thin film glass having a thickness of, for example, 120 μm or smaller, and more preferably having a thickness of 30 to 100 μm.

"Flexible" in the context of the present invention means that the glass base without causing crack or defect may be bent to a radius of curvature of 100 mm.

While methods of manufacturing and types of the thin film glass are not specifically limited, non-alkali glass which is suitably used for organic electronic devices in general is preferably used.

The thin film glass has advantages in that it has a barrier performance against water and oxygen, and that it has higher heat resistance as compared with resin film. Thus, the thin film glass is suitably used for the transparent base when applied to the organic electronic devices which are susceptible to performance degradation due to water and oxygen, or when necessarily heated at high temperatures in the manufacturing of the transparent surface electrode or assembling the organic electronic devices.

The transparent base may be subjected to surface treatment or an adhesion enhancing layer may be provided on the transparent base in order to improve adhesiveness between the base and the transparent surface electrode. Any of publicly known technologies are applicable to the surface treatment and the adhesion enhancing layer. Examples of the surface treatment include surface activating treatment such as corona discharge treatment, flame treatment, UV treatment, high-frequency treatment, glow discharge treatment, activated plasma treatment and laser treatment.

The adhesion enhancing layer is exemplified by layers composed of polyester, polyamide, polyurethane, vinyl-based copolymer, butadiene-based copolymer, acrylic copolymer, vinylidene-based copolymer, or epoxy-based copolymer. The adhesion enhancing layer may be configured by a single layer, or may be two or more layers in view of enhancing the adhesiveness.

When the transparent base is composed of resin film, a barrier coat layer may preliminarily be formed if necessary, or a hard coat layer may preliminarily be formed if necessary. The barrier coat layer may be formed on the top surface or back surface, as an inorganic coating, organic coating, or hybrid coating composed of the both, and is preferably a transparent substrate having barrier performance represented by a water vapor permeability, measured by a method in compliance with JIS K7129-1992 (25±0.5° C., relative humidity (90±2) % RH), of $1\times10^{-3}$ g/(m$^2$·24 h) or smaller, and more preferably has an oxygen permeability measured by a method in compliance with JIS K7126-1987 of $1\times10^{-3}$ ml/(m$^2$·24 h·atm) or smaller and a water vapor permeability (25±0.5° C., relative humidity (90±2) % RH) of $1\times10^{-3}$ g/(m$^2$·24 h) or smaller.

Materials for composing the barrier layer are arbitrarily selectable from materials having a function of suppressing intrusion of any substances that may degrade the device such as moisture and oxygen, for which silicon oxide, silicon dioxide, or silicon nitride may be used. For the purpose of improving brittleness of the layer, the barrier layer more preferably has a stacked structure composed of inorganic layer (s) and organic layer (s). While the order of stacking of the inorganic layer and the organic layer is not specifically limited, it is preferable to alternately stack the both multiple times.

[Patterned Metal Electroconductive Layer]

The patterned metal electroconductive layer in the present invention is a metal-containing layer and is formed on the transparent base according to a pattern having opening(s).

The opening is a portion where the patterned metal electroconductive layer is not formed on the transparent base and is therefore a translucent portion of the metal pattern.

While geometry of the pattern is not specifically limited, preferable patterns are exemplified by stripe, grid and honeycomb.

In the transparent surface electrode of the present invention, a ratio of area occupied by the openings relative to the whole area of the planar electrode, that is, an aperture ratio is preferably 80% or larger from the viewpoint of transparency.

For example, if the electroconductive portion has a stripe pattern, the aperture ratio of the stripe pattern having a line width of 100 μm and line intervals of 1 mm is approximately 90%.

The line width of pattern is preferably 10 to 200 μm from the viewpoints of transparency and electro conductivity.

In the stripe or grid pattern, the intervals of the thin lines are preferably 0.5 to 4 mm.

In the honeycomb pattern, length of each edge is preferably 0.5 to 4 mm.

Height of the thin lines is preferably 0.1 to 3.0 μm from the viewpoints of electroconductivity and prevention of current leakage.

(Method for Forming Patterned Metal Electroconductive Layer)

The patterned metal electroconductive layer in the present invention is formed by printing according to a pattern with a coating liquid containing metal particles for forming the patterned metal electroconductive layer.

The coating liquid containing metal particles for forming the patterned metal electroconductive layer is a metal particle dispersion containing the metal particle described later.

The metal particle dispersion contains the metal particle in a solvent such as water, alcohol or the like, and may contain a binder or a dispersion aid for assisting dispersion of the metal as needed.

The metal pattern may be formed using the metal particle dispersion by printing such as gravure printing, flexographic printing, screen printing, ink jet printing or the like.

The individual printings applicable to the present invention may be printings generally used for forming electrode patterns. More specifically, gravure printing include printings described in Japanese Patent Application Laid-open Publications Nos. 2009-295980, 2009-259826, 2009-96189 and 2009-90662, flexographic printing include printings described in Japanese Patent Application Laid-open Publications Nos. 2004-268319 and 2003-168560, and screen printing include printings described in Japanese Patent Application Laid-open Publications Nos. 2010-34161, 2010-10245 and 2009-302345.

Specific surface resistivity of the thin line portions of the patterned metal electroconductive layer is preferably 100Ω/□ or smaller, more preferably 10Ω/□ or smaller, and furthermore preferably 5Ω/□ or smaller in view of allowing expansion of the area. The specific surface resistivity may be measured in compliance, for example, with JIS K6911, ASTM D257 and so forth, simply by using a commercially available surface resistivity meter.

(Metal Particle)

Metals composing the metal particle used for the patterned metal electroconductive layer are not specifically limited so long as they are excellent in electroconductivity, where examples include metals such as gold, silver, copper, iron, nickel and chromium; and alloy.

From the viewpoint of electroconductivity, the metal is preferably silver or copper. Silver and copper may independently be used alone by themselves, may be used in combined with each other, may form alloy with each other or the one may plated with the other.

An average particle size of the metal particles preferably used herein falls in the range from an atomic scale size to 1000 nm.

In the present invention, the metal particles having an average particle size of 3 to 300 nm, and more preferably 5 to 100 nm are preferably used.

Among these particles, silver nano-particles having an average particle size of 3 nm to 100 mare preferably used, and the silver nano-particles having an average particle size of 5 nm to 100 nm are particularly preferable.

In the present invention, the average particle size is readily measured using a commercially available measuring instrument based on a light scattering scheme. Specifically, the average particle size means a value obtained by measuring 1 ml of diluted sample liquid using Zetasizer 1000 (from Malvern Instruments Ltd.) based on the laser Doppler method at 25° C.

(Surface Roughness Ra)

One of the features of the present invention resides in that the surface roughness Ra of the patterned metal electroconductive layer is 20 nm or smaller.

Value of Ra corresponds to the surface roughness specified by JIS B601 (1994) and is a value measured as described below in the present invention.

Ra in the present invention is obtained by measuring Ra on the thin line portions of the metal pattern, namely, by measuring Ra on a linear line having a length of 10 µm in the direction parallel to the lines of the metal pattern.

In the present invention, Ra is measured using a commercially available atomic force microscope (AFM), according to the method described in the next.

The AFM used herein is SPI3800N Probe Station and SPA400 multi-functional unit from Seiko Instruments Inc. A sample is placed on a horizontal sample stage on a piezo scanner, a cantilever is approached to the surface of the sample, and upon reaching the range where atomic force takes effect, scanning is performed with the cantilever in the X-Y direction so as to capture surface irregularity of the sample as a displacement of the piezoelectric element in the Z-direction.

The piezo scanner used herein is selectable from scanners capable of scanning over a length of 20 µm in the X-Y direction, and 2 µm in the Z-direction.

The cantilever used herein is a silicon cantilever SI-DF20 from Seiko Instruments Inc., with a resonance frequency of 120 to 150 kHz and a spring constant of 12 to 30 nm, and is used for measurement in Dynamic Force Mode (DFM).

In the measurement, the thin lines of the metal pattern and a measurement area are aligned in parallel or orthogonal to each other, and the tip of the probe is adjusted to point to the center of the width-wise direction of the thin line under a CCD camera, and a 10×10 µm area at the center of the thin line is measured with a scanning frequency of 0.1 Hz. After the measurement, 10-µm long lines are drawn at intervals of 0.9 µm at 10 sites in parallel to the thin lines, Ra on each of the lines is calculated, and an average value of obtained Ras is used as the Ra value.

Figure 1B:
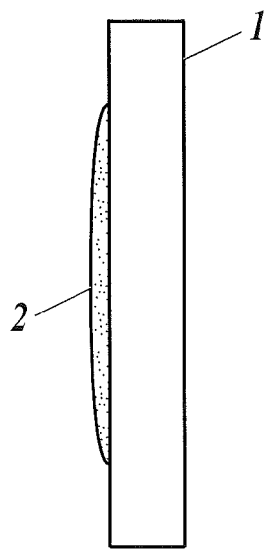
[FIG. 1B] This is a schematic drawing for explaining a method for measuring surface roughness Ra of a patterned metal electroconductive layer, which is a cross sectional view of the patterned metal electroconductive layer.

FIG. 1 is a schematic drawing for explaining a method described above, wherein FIG. 1A is a top view of the patterned metal electroconductive layer, and FIG. 1B is a cross sectional view of the patterned metal electroconductive layer.

Reference numeral 1 stands for the transparent base, 2 for the patterned metal electroconductive layer, 3 for an AFM measurement area, and 4 for an Ra measurement line.

In the present invention, the surface roughness Ra is characteristically specified as 20 nm or smaller from the viewpoint of bending durability, preferably 1.0 nm or larger and 15 nm or smaller, and more preferably 1.0 nm or larger and 10 nm or smaller.

By adjusting the surface roughness Ra of the patterned metal electroconductive layer to 20 nm or smaller, frequency of current leakage is found to be suppressed, and also the storability under high-temperature atmosphere is found to be improved.

The reason why such effects are obtained may be as follows, while not definitely revealed.

The metal pattern formed by printing has voids between the adjacent metal particles, in addition to fine irregularities ascribable to the metal particle per se on the surface thereof.

When the polymer electroconductive layer is formed by applying over such patterned metal electroconductive layer, trace amounts of air and solvent are caught in the voids, and thus the storability under high-temperature atmosphere is degraded.

Treatment such as heating or chemical etching described later, directed to the patterned metal electroconductive layer so as to adjust the surface roughness Ra in the range specified by the present invention, reduces the voids of the patterned metal electroconductive layer and thereby to successfully improve the storability.

The flexible organic electronic device bended multiple times is degraded in the performance, because stress is locally concentrated due to the fine irregularity, which promotes interfacial separation or accumulation of damages onto the organic functional layer.

Smoothening of the patterned metal electroconductive layer reduces such interfacial separation or accumulation of damages onto the organic functional layer, and to suppress degradation due to bending of the organic electronic device as a consequence.

Specific examples of methods of adjusting the surface roughness Ra of the patterned metal electroconductive layer to the range specified by the present invention include a method for forming the patterned metal electroconductive layer by printing on the transparent base, followed by heating at high temperatures (300° C. or above) or chemical etching, or a combination thereof.

For the case where a film substrate is used as the transparent base, heating at high temperatures may make it difficult for the substrate to keep its original shape, and thus chemical etching is preferable.

In the present invention, a more preferable embodiment relates to use of both of the heating at high temperatures and the chemical etching.

In the conventional organic electronic device using the transparent surface electrode composed of the patterned metal electroconductive layer and the polymer electroconductive layer stacked thereon, the current leakage has mainly been attributed to a large irregularity of the patterned metal electroconductive layer per se. The present inventors, however, found from our thorough investigations that the frequency of current leakage may be reduced by improving the smoothness of the metal pattern. Accordingly, the present inventors understand that the current leakage of the organic electronic device is mainly attributable to fine irregularities of the fine metal particles per se formed on the surface of the metal pattern formed by printing, rather than large irregularities of the patterned metal electroconductive layer per se. This may be because a high and gentle irregularity such as irregularity of the patterned metal electroconductive layer may completely be covered with the polymer electroconductive layer stacked thereon, whereas steep and protruding irregularity such as that of the fine metal particle may be difficult to be completely covered with the polymer electroconductive layer.

(Heating of Patterned Metal Electroconductive Layer at High Temperatures)

In the present invention, the surface roughness of the patterned metal electroconductive layer may be adjusted to the above-described range by applying the coating liquid for forming the patterned metal electroconductive layer according to a pattern by printing, followed by heating at high temperatures (300° C. or above).

In this case, the heating at high temperatures means treatment by heating at 300° C. or above. The high-temperature heating is preferably preceded by a first heating characterized by heating at 100 to 250° C. In the explanation below, the high-temperature heating will be referred to as a second heating.

In the present invention, it is preferable to conduct the first heating and the second heating in view of preventing aggregation of the metal particles and of preventing line breakage, wherein the first heating is preferably conducted at 100 to 250° C., and the second heating is preferably conducted at 300 to 500° C.

By the first heating, a solvent contained in the paste vaporizes, and thereby the fine metal particles adhere to the substrate. In addition, a dispersant which covers the fine metal particles vaporizes or decomposes, so that the fine metal particles are brought into direct contact to each other to thereby lower the resistivity of the patterned metal electroconductive layer.

Particle size effect of the fine metal particle which is fine also lowers the melting point, so that the fine metal particles are promoted to fuse with each other even in the temperature range of the second heating, and thereby the metal pattern is made more dense, and the surface of the metal pattern thereof is made smoother.

The first heating is preferably conducted in the range from 100 to 250° C., and more preferably from 150 to 250° C. from the viewpoints of adhesiveness to the substrate and aggregation.

While heating time depends on the temperature and size of the fine metal particles to be used, it is preferably 10 seconds or longer and 30 minutes or shorter, more preferably 10 seconds or longer and 15 minutes or shorter and furthermore preferably 10 seconds or longer and 5 minutes or shorter from the viewpoint of productivity.

For the case where the resin film is used for the transparent base as described above or where the chemical etching is conducted, it is preferable that the base having the metal particles printed thereon is heated at a temperature not causative of damage to the base, i.e., within the temperature range from 100° C. or above and lower than 250° C. from the viewpoint of electroconductivity and adhesiveness to the base, and then chemically etched as described below.

Methods of heating are not specifically limited and are selectable from publicly known methods. Examples of the methods include methods using a heater, IR heater or based on vacuum heating.

(Chemical Etching)

In the present invention, by printing the coating liquid for forming the patterned metal electroconductive layer according to a pattern followed by chemical etching, the surface roughness of the patterned metal electroconductive layer may be adjusted to the range specified by the present invention. The chemical etching may be conducted by bringing an etching solution containing a solution capable of corroding metal into contact with the patterned metal electroconductive layer.

Chemical etching time depends on the particle size of the fine metal particles to be used, and concentration of the etching solution, wherein it is preferably 1 to 180 seconds, and more preferably 1 to 30 seconds from the viewpoints of resistivity and bending durability of the transparent surface electrode.

The chemical etching is preferably followed by washing with water so as to thoroughly wash off the etching solution, and heating at 100° C. or above so as to thoroughly vaporize water off from the substrate.

A composition of the etching solution may be a composition of any general solution for etching metals. For the case where silver nano-particles are used as the fine metal particle, a blix (bleach fix) which is used for development of silver halide photosensitive material for color photograph is preferably used from the viewpoints of safety in handling and etchability.

While the etching solution is preferably an aqueous solution, the etching solution may alternatively use an organic solvent such as ethanol, so long as it can dissolve the bleach and fixer described in the next.

The bleach used in the blix is selectable from publicly known bleaches, wherein particularly preferable examples include organic complex salt of iron(III) (for example, complex salts of aminopolycarboxylic acids), or organic acids such as citric acid, tartalic acid and malic acid, persulfate and hydrogen peroxide.

Among the above examples, the organic complex salts of iron(III) are particularly preferable from the viewpoints of rapid processing and prevention of environmental pollution. Examples of aminopolycarboxylic acid or salts thereof useful for forming the organic complex salts of iron(III) include biodegradable [s,s]ethylenediamine disuccinate, N-(2-carboxylate ethyl)-L-aspartic acid, β-alanine diacetate, methylimino diacetate, ethylenediamine tetraacetate, diethylenetriamine pentaacetate, 1,3-diaminopropane tetraacetate, propylenediamine tetraacetate, nitrilo triacetate, cyclohexanediamine tetraacetate, imino diacetate, glycol etherdiamine tetraacetate and the compounds represented by the formula (I) or (II) described in European Patent No. 0789275.

Any sodium salt, potassium salt, lithium salt and ammonium salt of the above compounds may be used. Among the above compounds, [s,s]ethylenediamine disuccinate, N-(2-carboxylate ethyl)-L-aspartic acid, β-alanine diacetate, ethylenediamine tetraacetate, 1,3-diaminopropane tetraacetate and methylimino diacetate, iron(III) complex salts of the above are preferable. These ferric ion complex salts may be used as they are or may be formed in a solution using a ferric ion salts such as ferric sulfate, ferric chloride, ferric nitride, ferric ammonium sulfate, or ferric phosphate, and a chelating agent such as aminopolycarboxylic acid. The chelating agent may be used in excess for forming the ferric ion complex salts. Among these iron complex salts, aminopolycarboxylic iron complex is preferable, wherein the amount of addition of which is 0.01 to 1.0 mol/liter, preferably 0.05 to 0.50 mol/liter, more preferably 0.10 to 0.50 mol/liter, and particularly 0.15 to 0.40 mol/liter.

The fixer used for the blix is selectable from publicly-known fixers, such as water soluble silver halide dissolver exemplified by thiosulfate salts such as sodium thiosulfate and ammonium thiosulfate; thiocyanate salts such as sodium thiocyanate and ammonium thiocyanate; thioether compounds such as ethylenebis(thioglycolic acid) and 3,6-dithia-1,8-octanediol; and thiourea compounds. These compounds may be used alone or as a mixture of two or more species. A special blix composed of a combination of a fixer and a large amount of halide such as potassium iodide described in Japanese Patent Application Laid-open Publication No. S55-155354 may also be used. In the present invention, thiosulfate, and in particular ammonium thiosulfate is preferably used. The amount of fixer per one liter is preferably 0.3 to 2 mol, and more preferably 0.5 to 1.0 mol.

The blix preferably used in the present invention has pH in the range from 3 to 8, and more preferably from 4 to 7. For the purpose of adjusting pH, hydrochloric acid, sulfuric acid, nitric acid, bicarbonate, ammonia, potassium hydroxide, sodium hydroxide, sodium carbonate, potassium carbonate or the like may be added as necessary.

[Polymer Electroconductive Layer]

The polymer electroconductive layer in the present invention is a transparent polymer electroconductive layer containing an electroconductive polymer.

The electroconductive polymer preferably used herein is an electroconductive polymer containing a n-conjugated electroconductive polymer and a polyanion.

This sort of electroconductive polymer may readily be produced by allowing chemical oxidative polymerization of a precursor monomer for forming the n-conjugated electroconductive polymer described later, to proceed under the presence of an appropriate oxidizing agent, an oxidizing catalyst and a polyanion described later.

(n-Conjugated Electroconductive Polymer)

Examples of the n-conjugated electroconductive polymer used herein include chain electroconductive polymers composed of polythiophenes (including basic polythiophene, the same shall apply hereinafter), polypyrroles, polyindoles, polycarbazoles, polyanilines, polyacetylenes, polyfurans, polyparaphenylene vinylenes, polyazulenes, polyparaphenylenes, polyparaphenylene sulfides, polyisothianaphthenes, or polythiazyls.

From the viewpoints of electroconductivity, transparency and stability, preferable are polythiophenes and polyanilines, and polyethylene dioxythiophene is most preferable.

(n-Conjugated Electroconductive Polymer Precursor Monomer)

A precursor monomer has a n-conjugation system in the molecule thereof and is capable of forming, even after being polymerized by the action of an appropriate oxidizing agent, a n-conjugation system also in the principal chain of the resultant polymer. Examples include pyrroles and derivatives thereof, thiophenes and derivatives thereof, and anilines and derivatives thereof.

Specific examples of the precursor monomer include pyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxylpyrrole, 3-methyl-4-carboxylpyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole, thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-dineptyloxythiophene, 3,4-dioctyloxythiophene, 3,4-didecyloxythiophene, 3,4-didodecyloxythiophene, 3,4-ethylenedioxythiophene, 3,4-propylenedioxythiophene, 3,4-butenedioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene, aniline, 2-methylaniline, 3-isobutylaniline, 2-anilinesulfonic acid and 3-anilinesulfonic acid.

(Polyanion)

Polyanion is an oligomer or polymer having a plurality of anionic groups.

Preferable examples of the polyanion include substituted or unsubstituted polyalkylene, substituted or unsubstituted polyalkenylene, substituted or unsubstituted polyimide, substituted or unsubstituted polyamide, substituted or unsubstituted polyester and copolymers thereof. Polyanions composed of a constitutive unit having an anionic group and a constitutive unit having no anionic group are preferably used.

The polyanion is a solubilizing polymer for solubilizing the n-conjugated electroconductive polymer into a solvent. The anionic group of the polyanion functions as a dopant to the n-conjugated electroconductive polymer and improves electroconductivity and heat resistance of the n-conjugated electroconductive polymer.

The anionic group of the polyanion is selectable from functional groups capable of causing chemical oxidative doping to the n-conjugated electroconductive polymer, wherein preferable examples, from the viewpoints of readiness of manufacturing and stability, include a monosubstituted sulfuric ester group, monosubstituted phosphoric ester group, phosphate group, carboxyl group and sulfo group. From the viewpoint of effect of doping of the functional group to the n-conjugated electroconductive polymer, a sulfo group, monosubstituted sulfuric ester group and carboxyl group are more preferable.

Specific examples of the polyanion include poly(vinylsulfonic acid), poly(styrenesulfonic acid), poly(allylsulfonic acid), poly(acrylic acid ethylsulfonic acid), poly(acrylic acid butylsulfonic acid), poly-2-acrylamide-2-methylpropanesulfonic acid, poly(isoprenesulfonic acid), poly(vinylcarboxylic acid), poly(styrenecarboxylic acid), poly(allylcarboxylic acid), poly(acrylcarboxylic acid), poly(methacrylcarboxylic acid), poly-2-acrylamide-2-methylpropanecarboxylic acid, poly(isoprenecarboxylic acid), and poly(acrylic acid). The above polyanion may be a homopolymer, or a copolymer composed of two or more species.

The polyanion may also contain fluorine atoms. Specific examples include Nafion (from DuPont) which contains a perfluorosulfonate group, and Flemion (from Asahi Glass Co. Ltd.) which is composed of a perfluorovinyl ether containing a carboxylate group.

Among such polyanions, the compound containing a sulfonate group is preferable, because applying and drying thereof to form the polymer electroconductive layer followed by heating at 100° C. or above and 250° C. or below for one minute or longer may distinctively improve washing durability and solvent resistance of the applied film.

Among such polyanions, poly(styrenesulfonic acid), poly (isoprenesulfonic acid), poly(acrylic acid ethyl sulfonic acid), and poly(acrylic acid butylsulfonic acid) are preferable. These polyanions are excellent in compatibility with the non-electroconductive polymer containing hydroxyl groups described later, and may enhance electroconductivity of the resultant electroconductive polymer.

A degree of polymerization of the polyanion, in terms of the number of monomer units, is preferably 10 to 100000, and more preferably 50 to 10000 from the viewpoints of solubility in a solvent and electroconductivity.

Examples of methods for manufacturing the polyanion includes a method for directly introducing an anionic group into a polymer having no anionic group using an acid, a method for sulfonating a polymer having no anionic group using a sulfonating agent, and a method for polymerizing an anionic group-containing polymerizable monomer.

The method for polymerizing an anionic group-containing polymerizable monomer is exemplified by a method for allowing oxidative polymerization or radical polymerization of the anionic group-containing polymerizable monomer in a solvent under the presence of an oxidizing agent or polymerization catalyst.

Specifically, a predetermined amount of the anionic group-containing polymerizable monomer is dissolved in a solvent, and the mixture is kept at a constant temperature. Thereafter, a solution containing a predetermined amount of an oxidizing agent or a polymerization catalyst preliminarily dissolved therein is added to the mixture, and then the mixture is allowed to react for a predetermined length of time. Concentration of the polymer obtained by the reaction is adjusted to a desired level using a solvent. In this method, the anionic group-containing polymerizable monomer may be copolymerized with a polymerizable monomer having no anionic group.

The oxidizing agent, oxidation catalyst and solvent used for the polymerization of the anionic group-containing polymerizable monomer are same as an oxidizing agent, oxidation catalyst and solvent used for the polymerization of the n-conjugated electroconductive polymer.

The polymer obtained in the form of polyanion salt is preferably converted to a polyanionic acid. Examples of method for conversion into an anionic acid include ion exchanging using ion exchange resin, dialysis, and ultra-filtration. Among these methods, ultra-filtration is preferable from the viewpoint of readiness of operation.

The electroconductive polymer is also selectable from commercially available materials.

For example, an electroconductive polymer composed of poly(3,4-ethylene dioxythiophene) and polystyrenesulfonic acid (abbreviated as PEDOT-PSS) is commercially available under the trade name of Clevios Series from H. C. Starck GmbH, under the trade names of PEDOT-PSS483095 and 560598 from Aldrich Chemistry, and under the trade name of Denatron Series from Nagase ChemteX Corporation. Polyaniline is commercially available under the trade name of Ormecon Series from Nissan Chemical Industries, Ltd. In the present invention, these compounds are also preferably used.

A water soluble organic compound may be contained as a second dopant. The water soluble organic compound usable in the present invention is arbitrarily selectable from those publicly known, without special limitation. Preferably exemplified is an oxygen-containing compound.

The oxygen-containing compound usable for the present invention is not specifically limited so long as it contains oxygen, and is exemplified by a hydroxyl group-containing compound, carbonyl group-containing compound, ether group-containing compound and sulfoxide group-containing compound. The hydroxyl group-containing compound is exemplified by ethylene glycol, diethylene glycol, propylene glycol, trimethylene glycol, 1,4-butanediol and glycerin. Among these exemplified hydroxyl group-containing compound, ethylene glycol and diethylene glycol are preferable. The carbonyl group-containing compound is exemplified by isophorone, propylene carbonate, cyclohexanone and γ-butyrolactone. The ether group-containing compound is exemplified by diethylene glycol monoethyl ether. The sulfoxide group-containing compound is exemplified by dimethyl sulfoxide. These compounds may be used alone, or two or more species thereof may be used together, where at least one species is preferably selected from dimethyl sulfoxide, ethylene glycol and diethylene glycol.

(Non-Electroconductive Polymer Containing Hydroxyl Groups)

The present invention can provide a transparent surface electrode for manufacturing an organic electronic element that is suppressed in frequency of current leakage and is excellent in storability and bending durability while keeping a high level of transparency, by virtue of the polymer electroconductive layer which contains the electroconductive polymer and the non-electroconductive polymer having hydroxyl groups in combination and by virtue of the surface roughness of the patterned metal electroconductive layer adjusted in the above-described range.

In the present invention, transparency, electroconductivity, storability and bending durability are satisfied at the same time supposedly because the polymer electroconductive layer contains the non-electroconductive polymer having hydroxyl groups and may therefore be thickened without degrading the transparency, and also because the surface roughness Ra of the patterned metal electroconductive layer is adjusted to the above-described range.

The non-electroconductive polymer having hydroxyl groups used in the present invention is preferably water-soluble and preferably shows solubility such that 0.001 g or more of which can dissolve in 100 g of water at 25° C. The solubility may be measured using a haze meter or turbidimeter.

Examples of the non-electroconductive polymer having hydroxyl groups applicable to the present invention include poly(vinyl alcohols PVA-203, PVA-224 and PVA-420 (all from Kureha Corporation), hydroxypropylmethyl celluloses 60SH-06, 60SH-50, 60SH-4000 and 90SH-100 (all from Shin-Etsu Chemical Co. Ltd.), methyl cellulose SM-100 (from Shin-Etsu Chemical Co. Ltd.), cellulose acetates L-20, L-40 and L-70 (all from Daicel Corporation), carboxymethyl cellulose CMC-1160 (from Daicel Corporation), hydroxyethyl celluloses SP-200 and SP-600 (both from Daicel Corporation), alkyl acrylate copolymer Jurymers AT-210 and AT-510 (both from Toagosei Co. Ltd.), polyhydroxyethyl acrylate and polyhydroxyethyl methacrylate.

(Polymer (A))

In the present invention, a particularly preferable embodiment relates to the case where the non-electroconductive polymer containing hydroxyl groups is the polymer (A) containing structural units represented by the formula (1) and formula (2).

In the formulae (1) and (2), each of $R_1$ and $R_2$ independently represents a hydrogen atom or methyl group, each of $Q_1$ and $Q_2$ independently represents —C(=O)O— or —C(=O)NRa—. Ra represents a hydrogen atom or alkyl group, and each of $A_1$ and $A_2$ independently represents a substituted or unsubstituted alkylene group or —(CH$_2$CHRbO)x-CH$_2$CHRb—. Rb represents a hydrogen atom or alkyl group, and x represents average number of repeating units. y represents 0 or 1. Z represents an alkoxy group, —O—C(=O)—Rc, —O—SO$_2$—Rd or —O—SiRe$_3$. Each of Rc, Rd and Re independently represents an alkyl group, perfluoroalkyl group or aryl group. Assuming a constitutive ratio, in the polymer (A), of the structural unit represented by the formula (1) as m, and a constitutive ratio of the structural unit represented by the formula (2) as n, constitutive ratio m+n (mol %) satisfies 50≤m+n≤100, and m/(m+n)≥0.2.

In the present invention, the total of the constituents as the structural units represented by the formula (1) and formula (2), i.e., (m+n), more preferably falls in the range from 80 to 100 mol %.

The polymer (A) in the present invention may contain an additional structural unit, besides the structural unit represented by the formula (1) and the structural unit represented by the formula (2).

Preferably, the polymer (A) includes 20 mol % or more the structural unit represented by the formula (1) as the constituent, from the viewpoints of stability and water washing durability of the film.

In the structural unit having a hydroxyl group, represented by the formula (1) in the present invention, $R_1$ represents a hydrogen atom or methyl group.

$Q_1$ represents —C(=O)O— or —C(=O)NRa—, and Ra represents a hydrogen atom or alkyl group. The alkyl group is preferably, for example, a $C_{1-5}$ straight-chain or branched alkyl group, and is more preferably a methyl group.

Each of these alkyl groups may be substituted by a substituent. Examples of the substituent include alkyl group, cycloalkyl group, aryl group, heterocycloalkyl group, heteroaryl group, hydroxyl group, halogen atom, alkoxy group, alkylthio group, arylthio group, cycloalkoxy group, aryloxy group, acyl group, alkyl carbonamide group, aryl carbonamide group, alkyl sulfonamide group, aryl sulfonamide group, ureido group, aralkyl group, nitro group, alkoxy carbonyl group, aryloxycarbonyl group, aralkyloxycarbonyl group, alkylcarbamoyl group, arylcarbamoyl group, alkylsulfamoyl group, arylsulfamoyl group, acyloxy group, alkenyl group, alkynyl group, alkylsulfonyl group, arylsulfonyl group, alkyloxysulfonyl group, aryloxysulfonyl group, alkylsulfonyloxy group and arylsulfonyloxy group. Among these groups, a hydroxyl group and alkyloxy group are preferable.

The halogen atom includes fluorine atom, chlorine atom, bromine atom and iodine atom.

The alkyl group as an example of the substituent may be branched, and the number of carbon atoms thereof is preferably 1 to 20, more preferably 1 to 12, and furthermore preferably 1 to 8. Examples of the alkyl group include methyl group, ethyl group, propyl group, isopropyl group, butyl group, t-butyl group, hexyl group and octyl group.

The number of carbon atoms of the cycloalkyl group is preferably 3 to 20, more preferably 3 to 12, and furthermore preferably 3 to 8. Examples of the cycloalkyl group include cyclopropyl group, cyclobutyl group, cyclopentyl group and cyclohexyl group. The alkoxy group may be branched, and the number of carbon atoms thereof is preferably 1 to 20, more preferably 1 to 12, furthermore preferably 1 to 6, and most preferably 1 to 4. Examples of the alkoxy group include methoxy group, ethoxy group, 2-methoxyethoxy group, 2-methoxy-2-ethoxyethoxy group, butyloxy group, hexyloxy group and octyloxy group, among which ethoxy group is preferable. The alkylthio group may be branched, and the number of carbon atoms thereof is preferably 1 to 20, more preferably 1 to 12, furthermore preferably 1 to 6, and most preferably 1 to 4. Examples of the alkylthio group include methylthio group and ethylthio group. The number of carbon atoms of the arylthio group is preferably 6 to 20, and more preferably 6 to 12. Examples of the arylthio group include phenylthio group and naphthylthio group. The number of carbon atoms of the cycloalkoxy group is preferably 3 to 12, and more preferably 3 to 8. Examples of the cycloalkoxy group include cyclopropoxy group, cyclobutyloxy group, cyclopentyloxy group and cyclohexyloxy group. The number of carbon atoms of the aryl group is preferably 6 to 20, and more preferably 6 to 12. Examples of the aryl group include phenyl group and naphthyl group. The number of carbon atoms of the aryloxy group is preferably 6 to 20, and more preferably 6 to 12. Examples of the aryloxy group include phenoxy group and naphthoxy group. The number of carbon atoms of the heterocycloalkyl group is preferably 2 to 10, and more preferably 3 to 5. Examples of the heterocycloalkyl group include piperidino group, dioxanyl group and 2-morpholinyl group. The number of carbon atoms of the heteroaryl group is preferably 3 to 20, and more preferably 3 to 10. Examples of the heteroaryl group include thienyl group, and pyridyl group. The number of carbon atoms of the acyl group is preferably 1 to 20, and more preferably 1 to 12. Examples of the acyl group include formyl group, acetyl group and benzoyl group. The number of carbon atoms of the alkyl carbonamide group is preferably 1 to 20, and more preferably 1 to 12. Examples of the alkyl carbonamide group include acetamide group. The number of carbon atoms of the aryl carbonamide group is preferably 1 to 20, and more preferably 1 to 12. Examples of the aryl carbonamide group include benzamide group. The number of carbon atoms of the alkyl sulfonamide group is preferably 1 to 20, and more preferably 1 to 12. Examples of the alkyl sulfonamide group include methane sulfonamide group. The number of carbon atoms of the aryl sulfonamide group is preferably 1 to 20, and more preferably 1 to 12. Examples of the aryl sulfonamide group include benzene sulfonamide group and p-toluene sulfonamide group. The number of carbon atoms of the aralkyl group is preferably 7 to 20, and more preferably 7 to 12. Examples of the aralkyl group include benzyl group, phenetyl group and naphthylmethyl group. The number of carbon atoms of the alkoxy carbonyl group is preferably 1 to 20, and more preferably 2 to 12. Examples of the alkoxy carbonyl group include methoxycarbonyl group. The number of carbon atoms of the aryloxycarbonyl group is preferably 7 to 20, and more preferably 7 to 12. Examples of the aryloxycarbonyl group include phenoxy carbonyl group. The number of carbon atoms of the aralkyl oxycarbonyl group is preferably 8 to 20, and more preferably 8 to 12. Examples of the aralkyl oxycarbonyl group include benzyloxycarbonyl group. The number of carbon atoms of the acyloxy group is preferably 1 to 20, and more preferably 2 to 12. Examples of the acyloxy group include acetoxy group and benzoyloxy group. The number of carbon atoms of the alkenyl group is preferably 2 to 20, and more preferably 2 to 12. Examples of the alkenyl group include vinyl group, allyl group and isopropenyl group. The number of carbon atoms of the alkynyl group is preferably 2 to 20, and more preferably 2 to 12. Examples of the alkynyl group include ethynyl group. The number of carbon atoms of the alkylsulfonyl group is preferably 1 to 20, and more preferably 1 to 12. Examples of the alkylsulfonyl group includes a methylsulfonyl group and ethylsulfonyl group. The number of carbon atoms of the arylsulfonyl group is preferably 6 to 20, and more preferably 6 to 12. Examples of the arylsulfonyl group include phenylsulfonyl group and naphthylsulfonyl group. The number of carbon atoms of the alkyloxysulfonyl group is preferably 1 to 20, and more preferably 1 to 12. Examples of the alkyloxysulfonyl group include methoxysulfonyl group and ethoxysulfonyl group. The number of carbon atoms of the aryloxysulfonyl group is preferably 6 to 20, and more preferably 6 to 12. Examples of the aryloxysulfonyl group include phenoxy sulfonyl group and naphthoxy sulfonyl group. The number of carbon atoms of the alkylsulfonyloxy group is preferably 1 to 20, and more preferably 1 to 12. Examples of the alkylsulfonyloxy group include methylsulfonyloxy group and ethylsulfonyloxy group.

The arylsulfonyloxy group preferably has 6 to 20 carbon atoms, and more preferably 6 to 12 carbon atoms. Examples of the arylsulfonyloxy group include phenylsulfonyloxy group and naphthylsulfonyloxy group. The substituents may be same or different, and the substituents may further be substituted.

In the structural unit having a hydroxyl group represented by the formula (1) in the present invention, $A_1$ represents a substituted or unsubstituted alkylene group or —(CH$_2$CHRbO)x-CH$_2$CHRb—. The alkylene group preferably has 1 to 5 carbon atoms, and is more preferably an ethylene group or propylene group. These alkylene groups may be substituted by the substituents described above. Rb represents a hydrogen atom or alkyl group. The alkyl group is preferably a $C_{1-5}$ straight-chain or branched alkyl group, and is more preferably a methyl group. These alkyl groups may be substituted by the substituents described above. x represents an average number of repeating units, which is preferably 1 to 100, and more preferably 1 to 10. The number of repeating units shows a distribution, so that the notation represents an average value which may be rounded to the first decimal place.

In the structural unit represented by the formula (2) in the present invention, definitions for $R_2$, $Q_2$ and $A_2$ are synonymous to those for $R_1$, $Q_1$ and $A_1$ in the formula (1).

In structural unit represented by the formula (2) in the present invention, y represents 0 or 1. Z represents an alkoxy group, —O—C(=O)—Rc, —O—SO$_2$—Rd or —O—SiRe$_3$. The alkoxy group preferably has 1 to 12 carbon atoms for example, and is more preferably a methoxy group or ethoxy group, and furthermore preferably a methoxy group. These alkoxy groups may be substituted by the substituents described above.

Each of Rc, Rd and Re independently represents an alkyl group, perfluoroalkyl group, or aryl group. The alkyl group preferably has 1 to 12 carbon atoms, and is more preferably a methyl group or ethyl group, and furthermore preferably a methyl group. These alkyl groups may be substituted by the substituents described above. The perfluoroalkyl group preferably has 1 to 8 carbon atoms, and is more preferably a trifluoromethyl group or pentafluoroethyl group, and furthermore preferably a trifluoromethyl group. The aryl group is preferably, for example, a phenyl group or tolyl group, and more preferably a tolyl group. These alkyl groups, perfluoroalkyl groups and aryl groups may further be substituted by the substituents described above.

The polymer (A) in the present invention may be obtained by co-polymerizing monomers (1) and (2), major copolymerizable components of which respectively configure the structural units represented by the formulae (1) and (2).

The polymer (A) in the present invention may be obtained by radical polymerization using a general purpose polymerization catalyst. Mode of polymerization is exemplified by bulk polymerization, solution polymerization, suspension polymerization and emulsion polymerization, wherein solution polymerization is preferable. While polymerization temperature varies depending on a polymerization initiator to be used, the polymerization temperature is generally adjusted to −10 to 250° C., preferably 0 to 200° C., and more preferably 10 to 100° C.

The number-average molecular weight of the polymer (A) preferably falls in the range from 3,000 to 2,000,000, more preferably from 4,000 to 500,000, and furthermore preferably 5000 to 100000.

The number average molecular weight and molecular weight distribution of the polymer (A) may be measured by generally-known gel permeation chromatography (GPC). An employable solvent is not specifically limited so long as the solvent dissolves the polymer (A) therein. Preferable examples include tetrahydrofuran (THF), dimethylformamide (DMF) and dichloromethane (methylene chloride, $CH_2Cl_2$). THF and DMF are more preferable, and DMF is furthermore preferable. Measurement temperature is preferably 40° C., but not specifically limited.

In the polymer (A), content of a component having a number average molecular weight of 1000 or smaller is preferably 0 to 5% by mass. By suppressing the content of the low-molecular-weight component, exchange of electric charge in the direction vertical to the patterned metal electroconductive layer may be enhanced.

The content of the component having a number average molecular weight of 1000 or smaller may be suppressed to 0 to 5% by mass in the polymer (A) in the present invention by methods of removing the low-molecular-weight component such as reprecipitation and fractionation GPC or methods of suppressing generation of the low-molecular-weight component such as synthesis of monodisperse polymer by living polymerization. The reprecipitation is a method for removing the low-molecular-weight components such as a monomer, catalyst and oligomer by dissolving the polymer in a solvent capable of dissolving the polymer and dropping the solvent dissolving the polymer which shows a lower lytic potential to the polymer than the solvent used for dissolving the polymer, so as to allow the polymer to deposit again. The preparative GPC is a method for fractionating the polymer based on the molecular weight to thereby remove the target low-molecular-weight components by allowing the solution containing the polymer dissolved therein to pass through a polystyrene gel column of a recycling preparative system GPCLC-9100 (from Japan Analytical Industry Ltd.) and the like.

The living polymerization can yield the polymer having a uniform molecular weight because an initiation species is constantly generated over the duration, and side-reactions such as termination reaction is less likely to occur. The molecular weight is adjustable by controlling the amount of addition of the monomer. Thus, synthesizing of the polymer having a molecular weight of 20000 may suppress generating of the lower-molecular-weight component. From the viewpoint of adoptability to production, reprecipitation and living polymerization are preferable.

Molecular weight distribution of the polymer (A) in the present invention preferably falls in the range from 1.01 to 1.30, and more preferably from 1.01 to 1.25. The molecular weight distribution in the present invention is expressed by a ratio given by (weight average molecular weight/number average molecular weight).

Content of the component having a molecular weight of 1000 or smaller may be determined by integrating, in a GPC distribution chart, areas corresponded to a molecular weight of 1000 or smaller, and then dividing the integrated area by the total area of distribution.

Assuming now the amount of electroconductive polymer as 100 parts by mass, a ratio of the polymer (A) to the electroconductive polymer in the polymer electroconductive layer in the present invention preferably falls in the range from 30 to 900 parts by mass. From the viewpoints of an effect of assisting electroconductivity and transparency of the polymer (A), the ratio of the polymer (A) preferably falls in the range from 100 to 900 parts by mass.

(Formation of Polymer Electroconductive Layer)

The polymer electroconductive layer in the present invention may be formed, for example, by applying and subsequent drying of a coating liquid for forming polymer electroconductive layer, which coating liquid containing the electroconductive polymer composed of the π-conjugated electroconductive polymer component and the polyanion component, the non-electroconductive polymer having hydroxyl groups, and a solvent.

Water-based solvent is preferably used as the solvent. The water-based solvent herein means a solvent containing 50% by mass or more of water. Of course, the solvent may be pure water containing no other solvent. While the component other than water in the water-based solvent is not specifically limited so long as it is miscible with water. Preferably used is an alcoholic solvent, and in particular advantageous is isopropanol having a boiling point relatively close to the boiling point of water, from the viewpoint of smoothness of the resultant film and the like.

Methods of applying the coating liquid for forming the polymer electroconductive layer used herein is adequately selectable from roll coating, bar coating, dip coating, spin coating, casting, die coating, blade coating, bar coating, gravure coating, curtain coating, spray coating, doctor coating, relief printing (letterpress), stencil (screen) printing, planography (offset printing), intaglio (gravure) printing, spray printing, and ink jet printing.

The applying is adequately followed by drying for volatilizing the solvent. While conditions for the drying are not specifically limited, the drying is preferably conducted in a temperature range so as not to damage the base, electroconductive polymer and water-soluble polymer.

Dry thickness of the polymer electroconductive layer is adequately selectable considering the transparency of the polymer electroconductive layer and sheet resistivity required based on the size of the aperture of the patterned metal electroconductive layer.

For the case where the polymer electroconductive layer is composed of a crosslinked film, one preferable embodiment is such that the OH group contained in the polymer (A) contributes to form a strong crosslinked film through a dehydrating catalytic action of the polyanion contained in the electroconductive polymer as described above. Alternatively, the crosslinked film may be formed by using a crosslinking agent. The crosslinking agent is selectable from any publicly-known agents without special limitation, which are exemplified by epoxy-based, carbodiimide-based, isocyanate-based, melamine-based, isocyanate-based, cyclocarbonate-based, hydrazine-based, and formalin-based agents. It is also preferable to use a catalyst in combination in order to promote the reaction.

[Organic Electronic Element]

The organic electronic element of the present invention has the transparent surface electrode of the present invention, and has an organic functional layer and an opposing electrode.

The organic electronic element of the present invention is usable for various organic electronic devices. The organic functional layer is exemplified by an organic luminescent layer, organic photoelectric conversion layer, liquid crystal polymer layer and so forth, without particular limitation. In the present invention, the organic electronic element is particularly effective when the functional layer is thin and current-driven layer which is applicable to organic electronic element for an organic EL device, solar cell and so forth, namely, an organic luminescent layer or organic photoelectric conversion layer. In the present invention, the organic electronic element is preferably an organic electroluminescent element.

EXAMPLE

The present invention will specifically be explained below referring to Examples without limiting the present invention. Note that "%" in the description of Examples means "% by mass" unless otherwise specifically stated.

[Manufacturing of Film Substrate]
(Formation of Smoothening Layer)

A UV-curable organic/inorganic hybrid hard coat material from JSR Corporation was applied on a polyethylene naphthalate film (PEN film) of 100 μm thick, Opstar z7501 using a wire bar so as to attain an average dry thickness of 4 μm, dried at 80° C. for 3 minutes, and then cured under an air atmosphere using a high-pressure mercury lamp under a curing condition of 1.0 J/cm$^2$ to thereby form a smoothening layer.

(Formation of Gas Barrier Layer)

Next, over the substrate having the smoothening layer provided thereon, a gas barrier layer was formed under the conditions listed below.

<Coating Liquid for Forming Gas Barrier Layer>

A dibutyl ether solution containing 20% by mass perhydropolysilazane (PHPS) (Aquamica NN320, from AZ Electronic Materials S.A.) was applied over the substrate using a wire bar so as to attain a dry (average) thickness of 0.30 μm to thereby obtain a coated sample.

<Drying>

The thus-obtained coated sample was dried under atmosphere with a temperature of 85° C. and a relative humidity of 55% RH for 1 minute to thereby obtain a dried sample.

<Dehumidifying>

The dried sample was further kept under atmosphere with a temperature of 25° C. and a humidity of 10% RH (dew point=−8° C.) for 10 minutes for dehumidifying.

<Property Modification A>

The thus-dehumidified sample was modified using a property modification equipment described below to thereby form a gas barrier layer. The modification was proceeded at a dew point of −8° C.

<Property Modification Equipment>

Excimer irradiation equipment Model MECL-M-1-200, from M.D. COM. Inc.
Wavelength: 172 nm
Filler gas: Xe The sample immobilized on the moving stage was modified under the conditions listed below.

<Property Modification Conditions>

| | |
|---|---|
| Excimer light intensity (172 nm) | 60 mW/cm$^2$ |
| Distance between sample and light source | 1 mm |
| Stage heating temperature | 70° C. |
| Oxygen concentration in irradiation equipment | 1% |
| Excimer irradiation time | 3 seconds |

The film substrate (abbreviated as PEN in Table 1) for composing the transparent surface electrode with a gas barrier function was manufactured as described in the above, and then used for manufacturing of electrodes 22 and 23.

[Formation of Patterned Metal Electroconductive Layer]
(Ink Jet Printing)

Silver nano-particle ink (Harima NPS-J, from Harima Chemicals, Inc., average particle size=15 nm) was loaded on an ink jet printer equipped with a piezo-type ink jet recording head having a pressurizing unit and an electric field applying unit, with a nozzle diameter of 25 μm, a drive frequency of 12 kHz, the number of nozzles of 128, and a nozzle density of 180 dpi (dpi means the number of dots per 1 inch, or 2.54 cm). Then, a thin line grid with a line width of 50 μm, a height of 0.5 μm and a pitch of 1.0 mm was printed on a 3.0 cm×3.0 cm area on a 3-cm square glass substrate of 100 μm thick. Transparent electrodes 1 to 13, 18 and 24 were thus manufactured. On the other hand, an electrode 21 was manufactured by printing in the same way as described in the above except that gold nano-particle ink (NPG-J, from Harima Chemicals, Inc., average particle size=15 nm) was used.

(Direct Gravure Printing)

On a 3.0 cm×3.0 cm area on the 3-cm square glass substrate of 100 μm thick, a thin grid was printed using silver nano-particle ink (TEC-PR-020, from InkTec Co. Ltd., average particle size=20 nm) by direct gravure printing so as to attain a line width of 50 μm, a pitch of 1.0 mm and a height of 0.5 μm. A printing machine used herein was the gravure printing testing machine K303 Multicoater from RK Print Coat Instruments Ltd. Electrodes 14, 15 and 19 were thus manufactured. On the other hand, electrodes 22 and 23 were manufactured by conducting the printing in the same way, on the above-manufactured film substrate for composing the transparent surface electrode with a gas barrier performance (polyethylene naphthalate (PEN) film stacked with a barrier layer).

(Screen Printing)

On a 3.0 cm×3.0 cm area on the 3-cm square glass substrate of 100 μm thick, a thin grid was printed using a silver nano-particle ink (TEC-PA-010, from InkTec Co. Ltd., average particle size=60 nm) by screen printing so as to attain a line width of 50 μm, a pitch of 1.0 mm and a height of 0.5 μm. A printing machine used herein was a small-sized semiautomatic thick-film printing machine STF-150OP (from Tokai Shoji Co. Ltd.) with a plate having a wire diameter of 13 μm (from SONOCOM Co. Ltd.). Electrodes 16, 17 and 20 were thus manufactured.

(Firing of Patterned Metal Electroconductive Layer)

The electrodes 1 to 24 having the patterned metal electroconductive layers were heated using a heater under the individual conditions listed below.

The electrodes 1, 7 were heated at 220° C. for 2 minutes (condition 1).

The electrodes 14, 16, 22, 23 were heated at 150° C. for 2 minutes (condition 2).

The electrode 2 was heated at 220° C. for 2 minutes, and then heated at 240° C. for 2 minutes (condition 3).

The electrode 3 was heated at 200° C. for 2 minutes, and then heated at 300° C. for 2 minutes (condition 4).

The electrode 4 was heated at 220° C. for 2 minutes, and then heated at 350° C. for 2 minutes (condition 5).

The electrodes 5, 8 to 13, 15, 17, 21, 24 were heated at 150° C. for 2 minutes, and then heated at 400° C. for 2 minutes (condition 6).

The electrode 6 was heated at 220° C. for 2 minutes, and then heated at 550° C. for 2 minutes (condition 7).

The electrodes 18 to 20 were heated at 400° C. for 2 minutes (condition 8).

(Chemical Etching of Patterned Metal Electroconductive Layer)

The heated electrodes 7, 8, 15, 17, 23 were chemically etched using an etching solution having the composition below. Each electrode was dipped in the silver etching solution, washed with ultrapure water, and heated and dried using a heater at 150° C. for 10 minutes. The dipping time was three seconds for the electrodes 7 and 8, five seconds for the electrodes 15 and 23, and ten seconds for the electrode 17.

<Preparation of Silver Etching Solution>

| Iron(III) ammonium ethylenediamine tetraacetate | 60 g |
|---|---|
| Ethylenediamine tetraacetate | 2.0 g |
| Sodium metabisulfite | 15 g |
| Ammonium thiosulfate | 70 g |
| Maleic acid | 5.0 g |

The mixture was made up to 1 L with pure water, and pH was adjusted to 5.5 with sulfuric acid or aqueous ammonium solution, to thereby prepare an etching solution.

Also the annealed electrode 21 was chemically etched using an etching solution for gold. The etching solution used herein was AURUM (from Kanto Chemical Co. Inc.), and the etching was conducted in the same way with the silver etching, with an etching time of 3 seconds.

(Measurement of Surface Roughness Ra of Patterned Metal Electroconductive Layer)

In the measurement of surface roughness Ra, a measurement area and the thin lines of the metal pattern were aligned in parallel to each other, and the probe was adjusted to point to the center of the width-wise direction of the thin line under a CCD camera of an atomic force microscope (SPI3800N Probe Station and SPA400 multi-functional unit, from Seiko Instruments Inc.), and a 10×10 μm area was measured. After the measurement, 10-μm long lines were drawn at intervals of 0.9 μm at 10 sites in parallel to the thin lines, Ra was calculated on the lines, and an average value obtained therefrom was listed as the Ra value in Table 1.

[Formation of Polymer Electroconductive Layer]

On each of the thus heated, or thus heated and etched electrodes 1 to 24, the polymer electroconductive layer was stacked according to the method described below to thereby manufacture transparent surface electrodes 1 to 24. The polymer electroconductive layer was stacked on a 3.0 cm×3.0 cm area on the 3-cm square glass substrate, or a 3.0 cm×3.0 cm on the film substrate (PEN) for composing the transparent surface electrode with a gas barrier performance.

The electrodes 1 to 8 and 14 to 21 were coated with coating liquid A shown below, the electrode 9 was coated with coating liquid B shown below, the electrode 10 was coated with coating liquid C shown below, the electrode 11 was coated with coating liquid D shown below, the electrode 12 was coated with coating liquid E shown below, the electrode 13 was coated with coating liquid F shown below, and the electrode 24 was coated with coating liquid G shown below, respectively by extrusion coating while a slit gap of an extrusion head is adjusted so as to attain a dry thickness of 300 nm, and then heating was conducted at 250° C. for 1 minute. Also the electrodes 22 and 23 were coated with the coating liquid A shown below, and then heating was conducted at 150° C. for 1 minute.

(Preparation of Coating Liquid for Forming Polymer Electroconductive Layer)

<Coating Liquid A>

| PEDOT-PSS CLEVIOS PH510 (solid concentration = 1.89%, from H. C. Starck GmbH) | 1.59 g |
|---|---|
| P-1 (aqueous solution, solid content = 20%) | 0.35 g |
| Dimethyl sulfoxide (DMSO) | 0.08 g |

<Coating Liquid B>

| PEDOT-PSS CLEVIOS PH510 (solid concentration = 1.89%, from H. C. Starck GmbH) | 2.00 g |
|---|---|
| Dimethyl sulfoxide (DMSO) | 0.08 g |

<Coating Liquid C>

| PEDOT-PSS CLEVIOS PH510 (solid concentration = 1.89%, from H. C. Starck GmbH) | 1.59 g |
|---|---|
| Poly(vinyl alcohol) (PVA) PVA-235 (from Kureha Corporation), aqueous solution with solid content = 2% | 3.50 g |
| Dimethyl sulfoxide (DMSO) | 0.20 g |

<Coating Liquid D>

| | |
|---|---|
| PEDOT-PSS CLEVIOS PH510 (solid concentration = 1.89%, from H. C. Starck GmbH) | 1.59 g |
| P-2 (aqueous solution, solid content = 20%) | 0.35 g |
| Dimethyl sulfoxide (DMSO) | 0.08 g |

<Coating Liquid E>

| | |
|---|---|
| PEDOT-PSS CLEVIOS PH510 (solid concentration = 1.89%, from H. C. Starck GmbH) | 1.59 g |
| P-3 (aqueous solution, solid content = 20%) | 0.35 g |
| Dimethyl sulfoxide (DMSO) | 0.08 g |

<Coating Liquid F>

| | |
|---|---|
| PEDOT-PSS CLEVIOS PH510 (solid concentration = 1.89%, from H. C. Starck GmbH) | 1.59 g |
| Poly(vinyl pyrrolidone) PVP9 (from Wako Pure Chemical Industries, Ltd.) (aqueous solution, solid content = 2%) | 3.50 g |
| Dimethyl sulfoxide (DMSO) | 0.20 g |

<Coating Liquid G>

| | |
|---|---|
| PEDOT-PSS CLEVIOS PH510 (solid concentration = 1.89%, from H. C. Starck GmbH) | 1.59 g |
| P-4 (aqueous solution, solid content = 20%) | 0.35 g |
| Dimethyl sulfoxide (DMSO) | 0.08 g |

(Synthesis of Polymer (A))

Paragraphs below will describe methods of synthesizing P-1 which is the polymer (A) used for preparing the above coating liquid A, P-2 which is the polymer (A) used for preparing the above coating liquid D, P-3 which is the polymer (A) used for preparing the above coating liquid E, and P-4 which is the polymer (A) used for preparing the above coating liquid G.

<Exemplary Synthesis 1: Synthesis of P-1 as Polymer (A)>

In a 500 ml three-necked flask, 200 ml of tetrahydrofuran (abbreviated as THF, hereinafter) was placed, refluxed under heating for 10 minutes, and then cooled down to room temperature in a nitrogen atmosphere. Added were 2-hydroxyethyl acrylate (10.0 g, 86 mmol, MW: 116.05) and azobisisobutyronitrile (1.41 g, 8.5 mmol, MW: 164.11, abbreviated as AIBN, hereinafter), and the content was refluxed under heating for 5 hours. The reaction solution was cooled down to room temperature, dropped into 5000 ml of methyl ethyl ketone (abbreviated as MEK, hereinafter), and the mixture was stirred for one hour. MEK was decanted, the residue was washed three times with 200 ml each of MEK, the resultant polymer was dissolved in THF, and the content was transferred into a 100 ml flask. THF was removed by evaporation using a rotary evaporator, and the residue was dried under reduced pressure at 50° C. for 3 hours. As a consequence, 9.0 g of P-1 having a number-average molecular weight of 35700 and a molecular weight distribution of 2.3 was obtained (yield=90%).

Molecular weight was measured by GPC (Waters 2695, from Waters Corporation) under the conditions listed below.
<GPC Measurement Conditions>
Equipment: Waters 2695 (Separations Module)
Detector: Waters 2414 (Refractive Index Detector)
Column: Shodex Asahipak GF-7M HQ
Eluent: dimethylformamide (20 mm LiBr)
Flow rate: 1.0 ml/min
Temperature: 40° C.

<Exemplary Synthesis 2: Synthesis of P-2 as Polymer (A)>

P-2 was obtained in the same way with Exemplary Synthesis 1 described above except that hydroxymethyl acrylate was used as the monomer in place of 2-hydroxyethyl acrylate.

<Exemplary Synthesis 3: Synthesis of P-3 as Polymer (A)>

In a 200 ml three-necked flask, 100 ml of THF was placed, refluxed under heating for 10 minutes, and then cooled down to room temperature in a nitrogen atmosphere. Added were 2-hydroxyethyl acrylate (4.1 g, 35 mmol, MW: 116.05), Blemmer PME-900 (7.4 g, 15 mmol, MW: 496.29), and AIBN (0.8 g, 5 mmol, MW: 164.11), and the content was refluxed under heating for 5 hours. The reaction solution was cooled down to room temperature, dropped into 3000 ml of MEK, and the mixture was stirred for one hour. MEK was decanted, the residue was washed three times with 100 ml each of MEK, the resultant polymer was dissolved in THF, and the content was transferred into a 100 ml flask. THF was removed by evaporation using a rotary evaporator, and the residue was dried under reduced pressure at 50° C. for 3 hours. As a consequence, 10.3 g of P-3 having a number-average molecular weight of 33700 and a molecular weight distribution of 2.4 was obtained (yield=90%).

<Exemplary Synthesis 4: Synthesis of P-4 as Polymer (A)>

P-4 was obtained in the same way with Exemplary Synthesis 1 described above except that hydroxyethyl acrylamide was used as the monomer in place of 2-hydroxyethyl acrylate.

<<Evaluation of Transparent Surface Electrode>>

The transparent surface electrodes 1 to 24 manufactured above were evaluated with regard to transparency according to the methods below. Also electroconductivity (surface resistivity) was evaluated.

(Evaluation of Transparency of Transparent Surface Electrode)

Total luminous transmittance of each of the transparent surface electrodes 1 to 24 manufactured above was measured using a haze meter NDH5000 from Tokyo Denshoku Co. Ltd., and the transparency was evaluated according to the criteria below. Considering the use for the organic electronic device, the total luminous transmittance is preferably 75% or above, as given by marks ⊚ and ○.

⊚: 80≤(total luminous transmittance)
○: 75%≤(total luminous transmittance)<80%
Δ: 70%≤(total luminous transmittance)<75%
x: (total luminous transmittance)<70%

Results thus obtained are shown in Table 1.

(Evaluation of Electroconductivity of Transparent Surface Electrode)

Surface resistivity of each of the transparent surface electrodes 1 to 24 manufactured above was measured using a resistivity meter (Loresta GP Model MCP-T610, from Mitsubishi Chemical Analytech Co. Ltd.). All transparent surface electrodes were confirmed to show a surface resistivity of 5Ω/□ or smaller, proving themselves as transparent surface electrodes with excellent electroconductivity.

<<Manufacturing of Organic EL Device>>

[Manufacturing of ITO Substrate]

On a 3-cm square glass substrate and on a 3-cm square film substrate with gas barrier performance for composing the transparent surface electrode, an ITO (indium tin oxide) film was deposited by sputtering to a thickness of 150 nm to thereby form ITO substrates, and the ITO film was then patterned by a photolithography so as to leave it in the portions of an anode (15 mm×15 mm area at the center) and a lead-out electrode. In the same way, also a glass substrate having the ITO film in the portion of lead-out electrode (but not in the portion of anode (14 mm×15 mm area at the center)) was manufactured.

As for each of the transparent surface electrodes 1 to 24, in the same way with manufacturing of the transparent surface electrode, the patterned metal electroconductive layer was formed by printing in a 15 mm×15 mm area at the center of a 3-cm square glass substrate or a film substrate according to the conditions listed in Table 1, similarly followed by heating and etching. The polymer electroconductive layer was then stacked over a 17 mm×17 mm area at the center of the 3-cm square glass substrate or film substrate according to the method described above. The ITO lead-out electrode on the anode side was then formed by sputtering. The lead-out ITO electrode was formed so as to partially brought into contact with the patterned metal electroconductive layer.

The transparent surface electrodes 1 to 24 stacked with the polymer electroconductive layers were washed with ultrapure water and used as the anodes to manufacture the respective organic EL devices 1 to 24 according the procedures below. All layers above the hole transportation layer were formed by vacuum evaporation. The transparent surface electrode 9 having no electroconductive polymer stacked thereon was not washed. Also the transparent surface electrode 13 having a poly(vinyl pyrrolidone) (coating liquid F) stacked thereon was not washed because the electroconductive layer may partially removed by washing.

[Formation of Organic Layer]

Necessary amounts of constitutive materials for forming the individual elements were filled in separate evaporation crucibles of a commercially available vacuum evaporation apparatus. The crucibles for vacuum evaporation used herein were composed of a material suitable for resistance heating such as molybdenum or tungsten.

First, the hole transportation layer, organic luminescent layers, a hole blocking layer, and an electron transportation layer, all being constituents of the organic EL layer, were formed in this order in an 17 mm×17 mm area at the center.

<Formation of Hole Transportation Layer>

The vacuum evaporation apparatus was evacuated to a degree of vacuum of $1 \times 10^{-4}$ Pa, and the evaporation crucible filled with Compound 1 was electrically heated so as to proceed vacuum evaporation at a deposition rate of 0.1 nm/sec, to thereby form the hole transportation layer of 30 nm thick.

<Formation of Organic Luminescent Layers>

Next, the individual luminescent layers were formed according to the procedures below.

On the thus-formed hole transportation layer, Compound 2, Compound 3 and Compound 5 were co-deposited at a deposition rate of 0.1 nm/sec in the same area with the hole transportation layer so as to attain a composition of 13.0% by mass of Compound 2, 3.7% by mass of Compound 3, and 83.3% by mass of Compound 5 to thereby form a green-to-red phosphorescent organic luminescent layer of 10 nm thick with a luminescence peak at 622 nm.

Next, Compound 4 and Compound 5 were co-deposited at a deposition rate of 0.1 nm/sec in the same area with the green-to-red organic luminescent layer so as to attain a composition of 10.0% by mass of Compound 4 and 90.0% by mass of Compound 5 to thereby form a blue phosphorescent luminescent layer of 15 nm thick, with a luminescence peak at 471 nm.

<Formation of Hole Blocking Layer>

In the same area with the thus-formed organic luminescent layers, Compound 6 was further deposited by vacuum evaporation to thereby form a hole blocking layer of 5 nm thick.

<Formation of Electron Transportation Layer>

In the same area with the thus-formed hole blocking layer, CsF was co-deposited with Compound 6 so as to adjust the ratio of thickness of CsF to 10%, to thereby form the electron transportation layer of 45 nm thick.

[Chemical Formula 2]

Compound 1

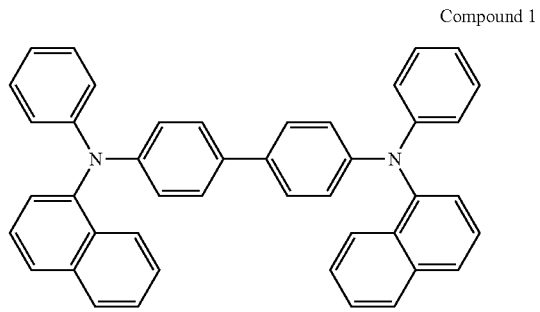

Compound 2

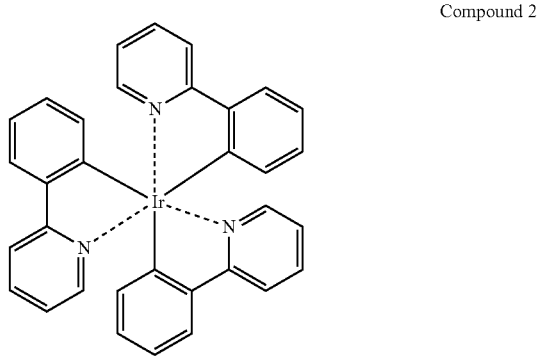

Compound 3

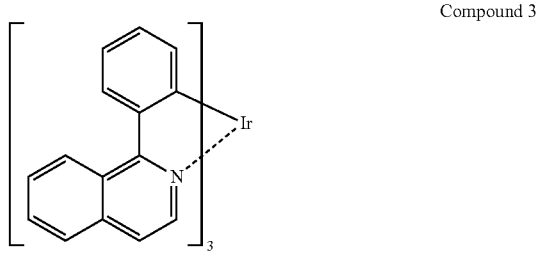

Compound 4

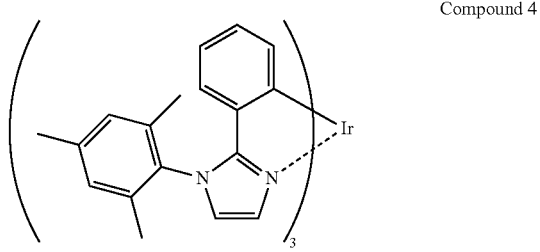

Compound 5

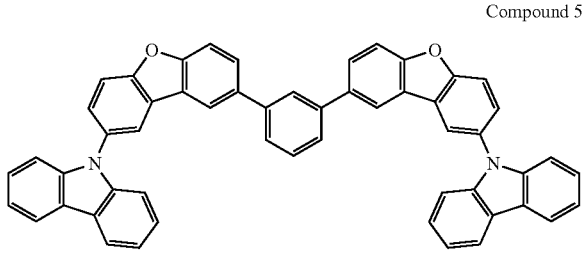

Compound 6

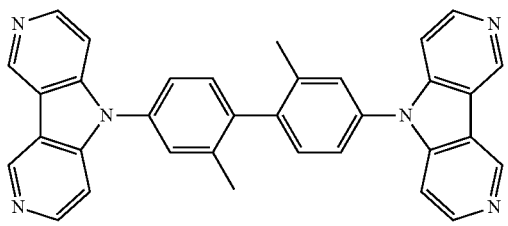

[Formation of Cathode]

On the thus-formed electron transportation layer, Al as a material for forming cathode was deposited through a mask by vacuum evaporation under a degree of vacuum of $5 \times 10^{-4}$ Pa to thereby form a 15 mm×22 mm cathode of 100 nm thick.

Then, in order to allow formation of lead-out terminals for the cathode and anode, an adhesive was applied around the anode excluding the end portion, bonded with a flexible sealer composed of a polyethylene terephthalate base having an $Al_2O_3$ film of 300 nm thick deposited thereon by vacuum evaporation. The adhesive was then cured by heating so as to form a sealing film. The organic EL devices 1 to 24, each of which had a 15 mm×15 mm luminescent area, were thus manufactured.

<<Evaluation of Organic EL Device>>

Current leakage resistance, storability in high-temperature atmosphere, and bending durability of each of the thus-obtained organic EL devices 1 to 24 were evaluated according to the criteria below. Uniform luminescence of the organic electronic devices 1 to 24 were visually observed.

(Evaluation of Current Leakage Resistance)

Ten samples of each of the organic EL devices 1 to 24 were produced, and current value of each sample was measured with voltage inverted between +3V and −3V, and rectification ratio was determined according to the equation below.

Rectification ratio=(Current value under+3V Applied Voltage)/(Current value under −3V Applied Voltage)

From the viewpoint of luminescence efficiency, the rectification ratio is preferably 1000 or larger. Among 10 samples of each of the organic EL devices, the samples having the rectification ratio exceeding 1000 were counted, and the current leakage resistance was evaluated according to the criteria below. In order to afford larger area, at least the level of ○ in the rank is essential, and the level of ◎ is particularly preferable.

◎: 8≤(number of samples with rectification ratio of 1000 or larger)

○: 5≤(number of samples with rectification ratio of 1000 or larger)<8

Δ: 3≤(number of samples with rectification ratio of 1000 or larger)<5

X: (number of samples with rectification ratio of 1000 or larger)<3

(Evaluation of Storability)

Applied voltage $V_1$ necessary to achieve a luminance of 1000 cd/m² was determined for each of the organic EL devices 1 to 24. Next, the individual organic EL devices were stored in a thermostatic chamber at 80° C. for 12 hours followed by applying of voltage $V_1$, and then luminance was measured. Halftime $T_1$ over which the luminance was reduced by half (500 cd/m²) was determined in the repeated heatings in the thermostatic chamber and the repeated measurements of luminance.

Next, an organic EL device A (base: glass base) and an organic EL device B (PEN base) were manufactured in the same way with the organic EL device except that the anode was formed by using ITO in place of the individual transparent surface electrodes 1 to 24. Also for these comparative organic EL devices A and B, the halftime $T_2$ was determined in the same way.

Next, a halftime ratio=(halftime $T_1$/halftime $T_2$)×100(%) was determined so as to be used as an index of durability, and the storability was evaluated according to the criteria below.

The organic EL devices 1 to 21, 24 were evaluated in a comparative manner with the organic EL device A, and the organic EL devices 22, 23 were evaluated in a comparative manner with the organic EL device B.

In the evaluation ranking below, the level of ○ or above is preferable, and the level of ◎ is particularly preferable.

◎: 120%≤(halftime ratio)
○: 100%≤(halftime ratio)<120%
Δ: 80%≤(halftime ratio)<100%
X: (halftime ratio)<80%

(Evaluation of Bending Durability)

The samples of the organic EL devices 1 to 24, before being sealed, were placed in a glove box under nitrogen atmosphere without exposing the samples to the air, repetitively bent 100 times under a rupture stress of 100 MPa. Then DC voltage was applied to the samples using Source-Measure Unit Model 2400 from Keithley Instruments Inc. so as to allow the samples to emit light at a luminance of 1000 cd/m². State of luminescence was visually observed, and the bending durability was evaluated according to the criteria below.

◎: Uniform luminescence, no problem
○: Acceptable in practice, with a partial non-uniformity in luminescence
Δ: Luminescence not observed for a half or more samples
X: Almost no luminescence Results of the individual evaluations are shown in Table 1.

TABLE 1

| | | | | | Polymer conductive layer | | Transparent surface electrode | | |
| | | | Treatment | | | hydroxyl group containing non-conductive polymer | | Evaluation | |
| electrode No. | Transparent base | printing | Heating | Chemical etching | Conductive polymer | | No. | Ra (nm) | transparency |
| --- | --- | --- | --- | --- | --- | --- | --- | --- | --- |
| 1 | Glass | Ink jet printing | 220° C. | — | PH510 | P-1 | 1 | 22.0 | ◎ |
| 2 | | | 220° C. → 240° C. | — | | | 2 | 25.0 | ◎ |
| 3 | | | 200° C. → 300° C. | — | | | 3 | 19.5 | ◎ |

TABLE 1-continued

| | | | | | | | | |
|---|---|---|---|---|---|---|---|---|
| 4 | | | 220° C. → 350° C. | — | | 4 | 5.4 | ◎ |
| 5 | | | 150° C. → 400° C. | — | | 5 | 5.0 | ◎ |
| 6 | | | 220° C. → 550° C. | — | | 6 | 21.0 | ◎ |
| 7 | | | 220° C. | done | | 7 | 5.6 | ◎ |
| 8 | | | 150° C. → 400° C. | done | | 8 | 1.1 | ◎ |
| 9 | | | 150° C. → 400° C. | — | — | 9 | 5.0 | X |
| 10 | | | | | PVA | 10 | 5.0 | ○ |
| 11 | | | | | P-2 | 11 | 4.8 | ◎ |
| 12 | | | | | P-3 | 12 | 5.0 | ◎ |
| 13 | | | | | PVA | 13 | 5.0 | Δ |
| 14 | | Gravure printing | 150° C. | — | P-1 | 14 | 26.0 | ◎ |
| 15 | | | 150° C. → 400° C. | done | | 15 | 11.0 | ◎ |
| 16 | | Screen printing | 150° C. | — | | 16 | 60.0 | ◎ |
| 17 | | | 150° C. → 400° C. | done | | 17 | 15.0 | ◎ |
| 18 | | Ink jet printing | 400° C. | — | | 18 | 100.0 | ◎ |
| 19 | | Gravure printing | | | | 19 | 170.0 | ◎ |
| 20 | | Screen printing | | | | 20 | 200.0 | ◎ |
| 21 | | Ink jet printing | 150° C. → 400° C. | done | | 21 | 4.4 | ◎ |
| 22 | PEN | Gravure printing | 150° C. | — | | 22 | 26.0 | ○ |
| 23 | | | 150° C. | done | | 23 | 13.0 | ○ |
| 24 | Glass | Ink jet printing | 150° C. → 400° C. | — | P-4 | 24 | 4.8 | ◎ |

| electrode No. | No. | Organic EL device Evaluation | | | Note |
|---|---|---|---|---|---|
| | | Current leak resisntance | Preserving property | Folding resistance | |
| 1 | 1 | X | Δ | Δ | Comparative Example |
| 2 | 2 | X | X | Δ | Comparative Example |
| 3 | 3 | ○ | ○ | ○ | Present Invention |
| 4 | 4 | ○ | ◎ | ○ | Present Invention |
| 5 | 5 | ○ | ○ | ○ | Present Invention |
| 6 | 6 | X | Δ | Δ | Comparative Example |
| 7 | 7 | ○ | ◎ | ○ | Present Invention |
| 8 | 8 | ◎ | | ◎ | Present Invention |
| 9 | 9 | ○ | X | Δ | Comparative Example |
| 10 | 10 | ○ | ○ | ○ | Present Invention |
| 11 | 11 | ○ | ◎ | ○ | Present Invention |
| 12 | 12 | ○ | ○ | ○ | Present Invention |
| 13 | 13 | ○ | X | ○ | Comparative Example |
| 14 | 14 | X | Δ | X | Comparative Example |
| 15 | 15 | ○ | ○ | ○ | Present Invention |
| 16 | 16 | X | X | X | Comparative Example |
| 17 | 17 | ○ | ○ | ○ | Present Invention |
| 18 | 18 | X | X | X | Comparative Example |
| 19 | 19 | X | | X | Comparative Example |
| 20 | 20 | X | | X | Comparative Example |
| 21 | 21 | ○ | ◎ | ○ | Present Invention |
| 22 | 22 | X | Δ | X | Comparative Example |
| 23 | 23 | ○ | ○ | ○ | Present Invention |
| 24 | 24 | ○ | ◎ | ○ | Present Invention |

As is clear from the results shown in Table 1, by adjusting the surface roughness Ra of the patterned metal electroconductive layer to 20 nm or smaller by heating or chemical etching, the current leakage resistance was found to improve, and thereby the organic electronic devices excellent in the storability in high-temperature atmosphere may be manufactured (see results of evaluation for the organic electronic devices 1 to 8).

It is also understood that particularly excellent transparency and storability may be achieved by using the polymer (A) for the polymer electroconductive layer.

Industrial Applicability

The transparent surface electrode of the present invention is suppressed in current leakage while keeping high transparency and excellent in storability and bending durability, and is therefore suitably used for the organic electronic element used for a display device, display and various types of emission light sources.

The invention claimed is:

1. A transparent surface electrode comprising:
   a patterned metal electroconductive layer which contains a metal on a transparent base; and
   a transparent polymer electroconductive layer which contains an electroconductive polymer over the base and the patterned metal electroconductive layer,
   wherein the patterned metal electroconductive layer has a surface roughness Ra, specified by JIS B0601(1994), of 20 nm or smaller, and the polymer electroconductive layer contains a non-electroconductive polymer having a hydroxyl group.

2. The transparent surface electrode of claim 1,
   wherein the non-electroconductive polymer having a hydroxyl group is a polymer (A) having structural units represented by the following General Formula (1) and General Formula (2);

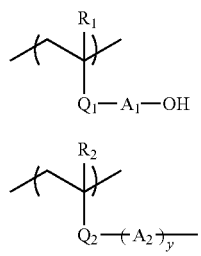

General Formula (1)

General Formula (2)

wherein, in the General Formula (1) and General Formula (2), each of $R_1$ and $R_2$ independently represents a hydrogen atom or methyl group; each of $Q_1$ and $Q_2$ independently represents —C(=O)O— or —C(=O)NRa—; Ra represents a hydrogen atom or alkyl group; each of $A_1$ and $A_2$ independently represents a substituted or unsubstituted alkylene group or —(CH$_2$CHRbO)x-CH$_2$CHRb—; Rb represents a hydrogen atom or alkyl group; x represents an average number of the repeating units; y represents 0 or 1; z represents an alkoxy group, —O—C(=O)-Rc, —O—SO$_2$-Rd or —O—SiRe$_3$; and each of Rc, Rd and Re independently represents an alkyl group, perfluoroalkyl group or aryl group, and
   wherein a constitutive ratio m+n (mol %) satisfies 50<m+n<100 and m/(m+n)>0.2 where a constitutive ratio of the structural unit represented by the General Formula (1) in the polymer (A) is m, and a constitutive ratio of the structural unit represented by the General Formula (2) in the polymer (A) is n.

3. A method for manufacturing a transparent surface electrode directed to manufacturing of the transparent surface electrode described in claim 1, the method comprising:
   forming the metal pattern by printing using a coating liquid for forming the patterned metal electroconductive layer which contains metal particles having an average particle size of 5 to 100 nm on the transparent base; and
   heating the formed metal pattern in the range from 300 to 500° C.

4. A method for manufacturing a transparent surface electrode directed to manufacturing of the transparent surface electrode described in claim 3, the method comprising:
   forming the metal pattern by printing using a coating liquid for forming a patterned metal electroconductive layer which contains metal particles having an average particle size of 5 to 100 nm on the transparent base, and
   chemically etching the formed metal pattern.

5. An organic electronic element comprising the transparent surface electrode described in claim 1.

6. The organic electronic element of claim 5,
   wherein the organic electronic element is an organic electroluminescent element.

* * * * *